United States Patent

Ohtsuka et al.

[11] Patent Number: 5,982,842
[45] Date of Patent: Nov. 9, 1999

[54] OUTPUT TIMER

[75] Inventors: Takahiro Ohtsuka; Nobusuke Abe, both of Tokyo; Yoshikazu Satoh, Hyogo, all of Japan

[73] Assignees: Mitsubishi Electric Semiconductor Software Co., Ltd., Hyogo; Mitsubishi Denki Kabushiki Kaisha, Tokyo, both of Japan

[21] Appl. No.: 08/990,595

[22] Filed: Dec. 15, 1997

[30] Foreign Application Priority Data

Jun. 23, 1997 [JP] Japan .................................. 9-166300

[51] Int. Cl.[6] ...................................................... G01D 3/00
[52] U.S. Cl. ............................................. 377/20; 327/151
[58] Field of Search .............................. 377/20; 327/144, 327/151; 364/528.41; 702/79, 178

[56] References Cited

U.S. PATENT DOCUMENTS 5,365,183  11/1994  Mitsuhira ................................. 327/144

FOREIGN PATENT DOCUMENTS

6-45886  2/1994  Japan .

*Primary Examiner*—Kenneth B. Wells
*Assistant Examiner*—Minh Nguyen
*Attorney, Agent, or Firm*—Leydig, Voit & Mayer, Ltd.

[57] ABSTRACT

An output timer includes a capture register for capturing a count value held by a free running up-counter in coorporation with a transmission gate in response to an event signal applied to the output timer. An adder adds a first value stored in another register to the count value captured by the capture register and produces a sum. A comparator compares a count value held by the free running up-counter with the sum and outputs a coincidence signal when the count value and sum are equal to each other. A set-reset flip-flop includes a set terminal for receiving the event signal and a reset terminal connected to the output terminal of the comparator.

8 Claims, 7 Drawing Sheets

OUTPUT TIMER

BACKGROUND OF THE INVENTION

1. Field of the Invention

The present invention relates to an output timer for use in household electrical appliances such as microprocessor-controlled rice boilers, products such as motor vehicles, and manufactured goods.

2. Description of the Prior Art

Figure 9:
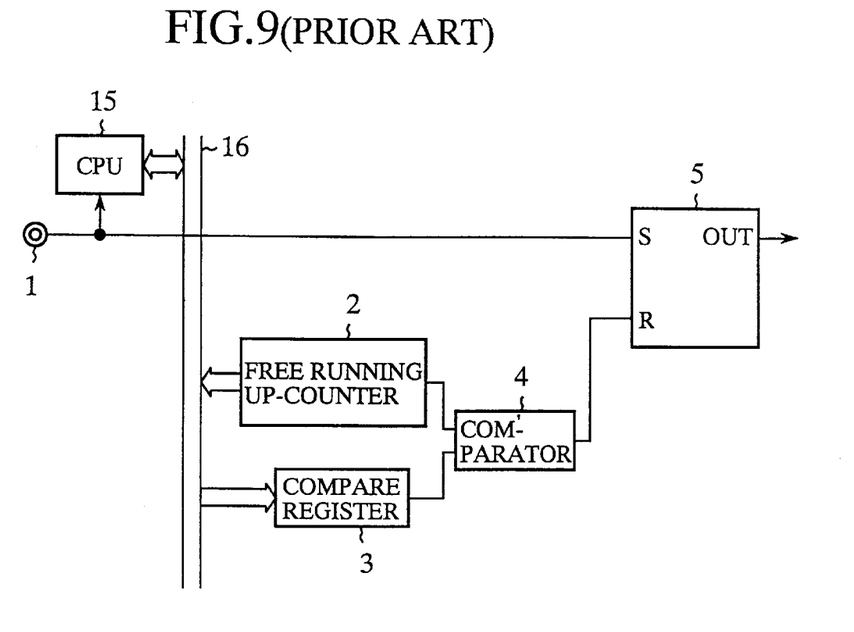
FIG. 9 is a block diagram showing the structure of an example of a prior art output timer.

Referring now to FIG. 9, there is illustrated a block diagram showing the structure of an example of a prior art output timer. In the figure, reference numeral 1 denotes an event terminal to which an event signal for indicating the occurrence of an event is applied, reference numeral 2 denotes a free running up-counter which is built to continue to run unless a stop signal from outside is applied thereto even though an event signal is applied to the output timer, and which counts clock pulses applied thereto at predetermined intervals, and increments and holds the count as a numerical count value, and reference numeral 3 denotes a compare register into which a predetermined value to be compared with the count value held by the free running up-counter 2 can be written via a data bus 16 by a CPU 15. Reference numeral 4 denotes a comparator for comparing the count value held by the free running up-counter 2 with the predetermined value written into the compare register 3, and for furnishing a coincidence signal when they are coincident, that is, when they are equal to each other, and reference numeral 5 denotes a set-reset flip-flop having its set terminal S connected to the event terminal 1, its reset terminal R connected to the output terminal of the comparator 4, and its output terminal OUT.

Figure 10:
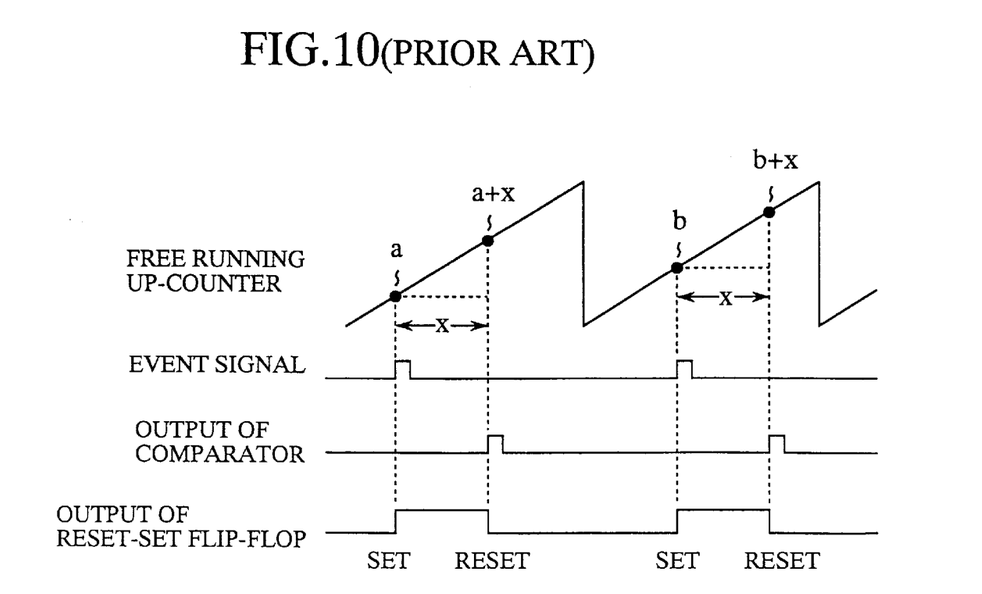
FIG. 10 is a timing chart showing the operation of the prior art output timer shown in FIG. 9.

Referring next to FIG. 10, there is illustrated a timing chart showing the operation of the prior art output timer shown in FIG. 9. A description will be made as to the operation of the prior art output timer with reference to FIGS. 9 and 10.

When an event occurs, an event signal informing the occurrence of the event is applied to the event terminal 1 if it is necessary to activate the output timer. The event signal applied to the event terminal 1 is then delivered to the set terminal S of the set-reset flip-flop 5. As a result, an output signal which appears at the output terminal OUT of the set-reset flip-flop 5 makes a LOW to HIGH transition. Simultaneously, the event signal applied to the event terminal 1 is also delivered, as an interrupt signal, to the CPU 15. In response to the interrupt signal, the CPU 15 reads the count value (a) held by the free running up-counter 2 by way of the data bus 16. The CPU 15 then adds a preprogrammed value (x) to be added, which is equal to an increment corresponding to the duration of a one-shot pulse asserted HIGH of the output signal which will appear at the output terminal OUT, to the read count value (a) of the free running up-counter 2, and stores the addition result (a+x) in the compare register 3 by way of the data bus 16.

After that, the comparator 4 starts to compare the current count value held by the free running up-counter 2 with the addition result (a+x) stored in the compare register 3. When they are equal to each other, the comparator 4 furnishes a coincidence signal indicating that they are equal to each other to the reset terminal R of the set-reset flip-flop 5. As a result, the set-reset flip-flop 5 is reset and hence the output signal which appears at the output terminal OUT is caused to make a HIGH to LOW transition. The output timer thus completes the delivery of a one-shot output pulse asserted HIGH having the duration which corresponds to the predetermined value (x) to be added.

Similarly, when another event occurs and the CPU 15 then reads the current count value (b) of the free running up-counter 2, the CPU 15 adds the preprogrammed value (x) to be added to the read count value (b) of the free running up-counter 2, and stores the addition result (b+x) in the compare register 3 by way of the data bus 16. The comparator 4 then starts to compare the current count value held by the free running up-counter 2 with the addition result (b+x) stored in the compare register 3. When they are equal to each other, the comparator 4 furnishes a coincidence signal indicating that they are equal to each other to the reset terminal R of the set-reset flip-flop 5. As a result, the set-reset flip-flop 5 is reset and hence the output signal which appears at the output terminal OUT is caused to make a HIGH to LOW transition. The output timer thus completes the delivery of a further one-shot output pulse asserted HIGH having the duration which corresponds to the predetermined value (x) to be added, like the aforementioned case.

The prior art output timer which is constructed as mentioned above needs to furnish an interrupt request to the CPU 15 so as to cause the CPU 15 to handle the interrupt, that is, read the count value held by the free running up-counter 2, add a predetermined value (x) to be added to the count value, and store the addition result in the compare register 3, each time an event occurs. Thus, a problem with the prior art output timer is that the load on the CPU 15 is increased.

Furthermore, since a measure of time is needed in order for the CPU 15 to handle the interrupt, there is a possibility that the count value held by the free running up-counter 2 exceeds the addition result before the addition result is stored in the compare register 3 and hence the set-reset flip-flop 5 is kept in a state wherein it is not reset. In such a case, the output timer cannot provide desired output pulses.

SUMMARY OF THE INVENTION

The present invention is made to overcome the problems with conventional output timers. It is therefore an object of the present invention to provide an output timer which can reduce the load on the CPU and prevent the set-reset flip-flop built therein from being kept in a state wherein it is not reset, and having real time capability superior to conventional output timers.

In accordance with one aspect of the present invention, there is provided an output timer comprising an event terminal for receiving an event signal indicating the occurrence of an event, a counter for counting clock pulses applied thereto and for holding the count as a numerical count value, a capture register for capturing and storing the count value held by the counter in corporation with a transmission gate in response to an event signal applied to the output timer by way of the event terminal, another register for storing a predetermined value which corresponds to a predetermined time interval, a computation unit for computing a count value which the counter will reach at the expiration of the predetermined time interval from the count value stored in the capture register and the predetermined value stored in the other register, a compare register for storing the count value obtained by the computation unit as a computation result, a comparator for comparing a count value held by the counter with the computation result stored in the compare register and for furnishing a coincidence signal by way of an output terminal when they are equal to each other, and a reset-set flip-flop having a first input terminal connected to the event terminal and used for setting the reset-set flip-flop and a second input terminal connected to the output terminal of the comparator and used for resetting the reset-set flip-flop.

In accordance with a preferred embodiment of the present invention, the counter can be a free running counter which can continue to run unless a stop signal from outside is applied thereto.

Preferably, the free running counter can be a free running up-counter which increments its count value held therein each time it counts a clock pulse, and the computation unit is an adder which adds the predetermined value stored in the other register to the count value stored in the capture register and then furnishes the addition result.

Alternatively, the free running counter can be a free running down-counter which decrements its count value held therein each time it counts a clock pulse, and the computation unit is a subtracter which subtracts the predetermined value stored in the other register from the count value stored in the capture register and then furnishes the subtraction result.

In accordance with another aspect of the present invention, there is provided an output timer comprising an event terminal for receiving an event signal indicating the occurrence of an event, a counter for counting clock pulses applied thereto and for holding the count as a numerical count value, a capture register for capturing and storing the count value held by the counter in corporation with a transmission gate in response to an event signal applied to the output timer by way of the event terminal, a first storage unit for storing a plurality of predetermined values which correspond to a plurality of predetermined time intervals, respectively, a computation unit for computing a plurality of count values which the counter will reach at the expiration of the plurality of predetermined time intervals from the count value stored in the capture register and the plurality of predetermined values stored in the first storage unit, a second storage unit for storing the plurality of count values computed by the computation unit as a plurality of computation results, a plurality of comparators each for comparing a count value held by the counter with each of the plurality of computation results stored in the second storage unit and for furnishing a coincidence signal by way of an output terminal when they are equal to each other, an OR gate having a plurality of input terminals one of which is connected to the event terminal and the others of which are connected to the plurality of output terminals of the plurality of comparators, respectively, and an output terminal, and a T (trigger or toggle) flip-flop having an input terminal connected to the output terminal of the OR gate.

In accordance with a preferred embodiment of the present invention, the counter can be a free running counter which can continue to run unless a stop signal from outside is applied thereto.

Preferably, the free running counter can be a free running up-counter which increments its count value held therein each time it counts a clock pulse, and the computation unit is a plurality of adders each of which adds each of the plurality of predetermined values stored in the first storage unit to the count value stored in the capture register and then furnishes the addition result.

Alternatively, the free running counter can be a free running down-counter which decrements its count value held therein each time it counts a clock pulse, and the computation unit is a plurality of subtracters each of which subtracts each of the plurality of predetermined values stored in the first storage unit from the count value stored in the capture register and then furnishes the subtraction result.

Further objects and advantages of the present invention will be apparent from the following description of the preferred embodiments of the invention as illustrated in the accompanying drawings.

DETAILED DESCRIPTION OF THE PREFERRED EMBODIMENTS

First Embodiment

Figure 1:
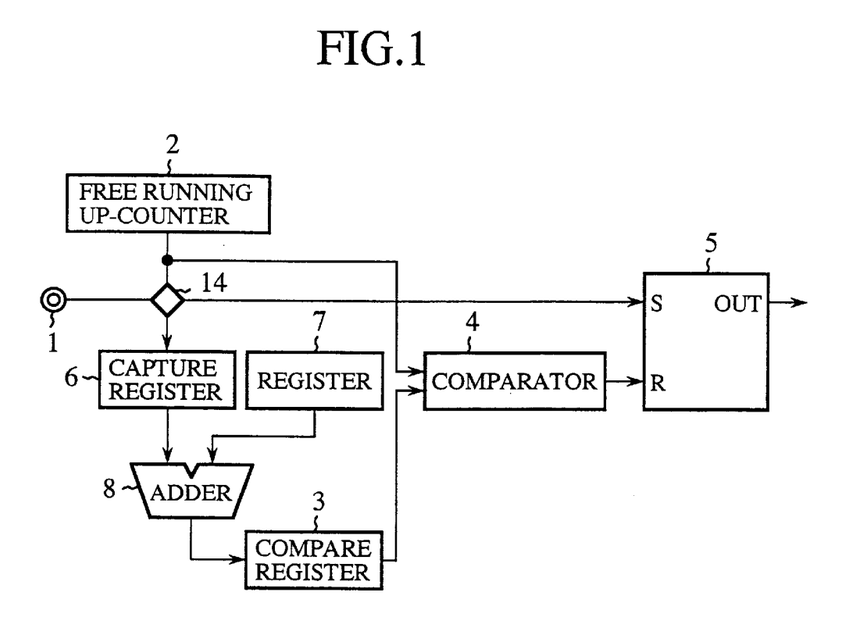
FIG. 1 is a block diagram showing the structure of an output timer according to a first embodiment of the present invention.

Referring now to FIG. 1, there is illustrated a block diagram showing the structure of an output timer according to a first embodiment of the present invention. In the figure, reference numeral 1 denotes an event terminal to which an event signal for indicating the occurrence of an event is applied, reference numeral 2 denotes a free running up-counter which is built to continue to run unless a stop signal from outside is applied thereto even though an event signal is applied to the output counter, and which counts clock pulses applied thereto at predetermined intervals, and increments and holds the current count as a numerical count value, and reference numeral 3 denotes a compare register for storing an addition result obtained by an adder which will be mentioned below. Reference numeral 4 denotes a comparator for comparing the current count value held by the free running up-counter 2 with the addition result stored in the compare register 3, and for furnishing a coincidence signal when they are coincident, that is, they are equal to each other, and reference numeral 5 denotes a set-reset flip-flop provided with its set terminal S connected to the event terminal 1, its reset terminal R connected to the output terminal of the comparator 4, and its output terminal OUT. Reference numeral 6 denotes a capture register for capturing and storing the current count value held by the free running up-counter 2, and reference numeral 7 denotes another register used for storing a predetermined value (x) to be added which defines the pulse duration of the output signal which is to be sent out by the output timer according to the first embodiment of the present invention. That is, the predetermined value (x) corresponds to a predetermined time interval. Reference numeral 8 denotes an adder which adds the predetermined value (x) to be added stored in the register 7 to the count value which has been captured by the capture register 6 and then furnishes the addition result (a+x), and reference numeral 14 denotes a transmission gate for connecting the output terminal of the free running up-counter 2 to the input terminal of the capture register 6 in response to the event signal applied to the event terminal 1 so as to deliver the current count value held by the free running up-counter 2 to the capture register 6.

Figure 2:
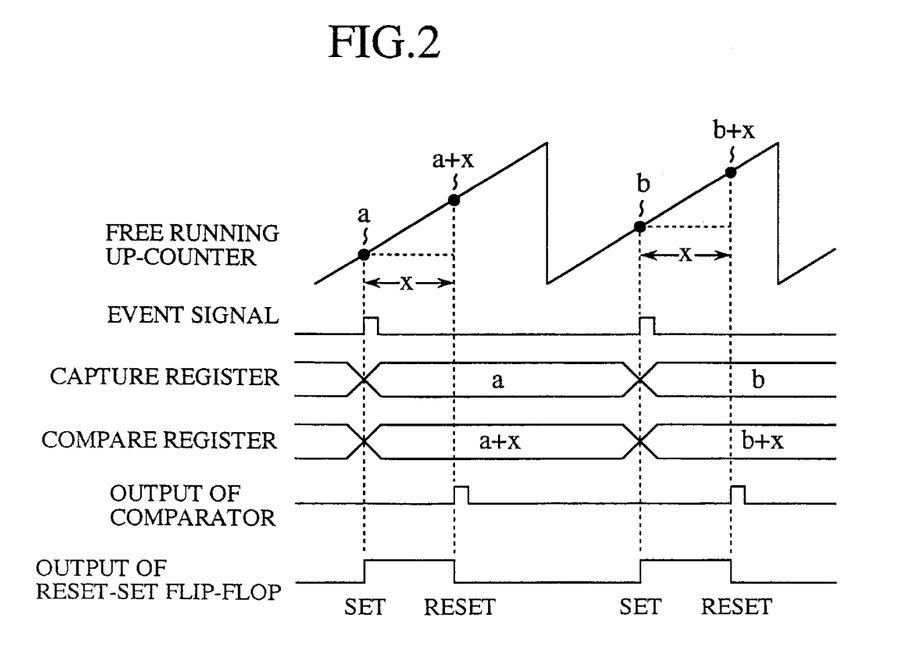
FIG. 2 is a timing chart showing the operation of the output timer according to the first embodiment of the present invention shown in FIG. 1.

Referring next to FIG. 2, there is illustrated a timing chart showing the operation of the output timer according to the first embodiment of the present invention shown in FIG. 1. A description will be made as to the operation of the output timer with reference to FIGS. 1 and 2.

When an event occurs, an event signal indicating the occurrence of the event is applied to the event terminal 1 if it is necessary to activate the output timer. The event signal applied to the event terminal 1 is then delivered to the set terminal S of the set-reset flip-flop 5. As a result, an output signal which appears at the output terminal OUT of the set-reset flip-flop 5 makes a LOW to HIGH transition, as shown in FIG. 2. Simultaneously, the transmission gate 14 connects the output terminal of the free running up-counter 2 to the input terminal of the capture register 6 in response to the event signal applied thereto via the event terminal 1 to deliver the current count value (a) held by the free running up-counter 2 to the capture register 6. The capture register 6 thus captures the current count value (a) held by the free running up-counter 2. The adder 8 then adds a predetermined value (x) to be added, which is prestored in the register 7 and which is equal to an increment corresponding to the pulse duration of a one-shot pulse asserted HIGH of the output signal which will appear at the output terminal OUT, to the count value (a) which has been captured by the capture register 6, and then stores the addition result (a+x) in the compare register 3. In other words, the adder 8 obtains the count value which the free running up-counter 2 will reach at the expiration of a predetermined time interval which corresponds to the predetermined pulse duration since the output timer receives the event signal.

After that, the comparator 4 starts to compare the current count value held by the free running up-counter 2 with the addition result (a+x) stored in the compare register 3. When they are equal to each other, that is, when the free running up-counter 2 reaches the addition result (a+x), the comparator 4 furnishes a coincidence signal indicating that the current count value reaches the addition result (a+x) to the reset terminal R of the set-reset flip-flop 5. As a result, the set-reset flip-flop 5 is reset and hence the output signal which appears at the output terminal OUT is caused to make a HIGH to LOW transition. The output timer thus completes the delivery of a one-shot output asserted HIGH having the pulse duration which corresponds to the predetermined value (x) to be added.

Similarly, when another event occurs and the capture register 6 then captures the current count value (b) of the free running up-counter 2, the adder 8 adds the predetermined value (x) to be added which is prestored in the register 7 to the count value (b) of the free running up-counter 2 which has been captured by the capture register 6, and then stores the addition result (b+x) in the compare register 3. The comparator 4 then starts to compare the current count value held by the free running up-counter 2 with the addition result (b+x) stored in the compare register 3. When the free running up-counter 2 reaches the addition result (b+x), the comparator 4 furnishes a coincidence signal indicating that the current count value reaches the addition result (b+x) to the reset terminal R of the set-reset flip-flop 5. As a result, the set-reset flip-flop 5 is reset and hence the output signal which appears at the output terminal OUT is caused to make a HIGH to LOW transition. The output timer thus completes the delivery of a further one-shot output asserted HIGH having the pulse duration which corresponds to the predetermined value (x) to be added, like the aforementioned case.

As mentioned above, the output timer according to the first embodiment of the present invention implements the interrupt processing to read a count value held by the free running up-counter 2, add a predetermined value (x) to be added to the count value, and store the addition result in the compare register 3, which has been implemented via software in the CPU of a prior art output timer, by using the hardware. Accordingly, the load on the CPU can be reduced. Furthermore, the addition result can be stored in the compare register 3 at a higher speed as compared with the conventional interrupt processing implemented via software. This results in being able to prevent the reset-set flip-flop 5 from being kept in a state wherein it is not reset. The first embodiment of the present invention thus offers an advantage of being able to provide an output timer having real time capability superior to conventional output timers.

Furthermore, since the free running up-counter 2 for use in the output timer of the first embodiment can continue to run even though an event signal from outside is applied to the output timer, the output timer can send out a one-shot output with stability at all times. It will be obvious to those skilled in the art that the first embodiment is not limited to such the structure and a normal up-counter can be used instead of the free running up-counter 2.

Second Embodiment

Figure 3:
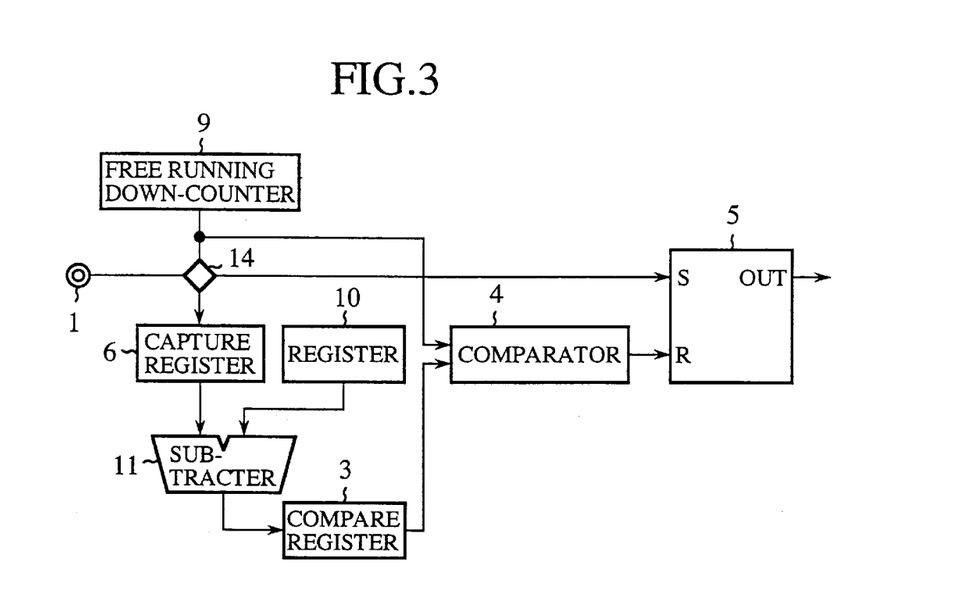
FIG. 3 is a block diagram showing the structure of an output timer according to a second embodiment of the present invention.

Referring now to FIG. 3, there is illustrated a block diagram showing the structure of an output timer according to a second embodiment of the present invention. In the figure, the same reference numerals as FIG. 1 denote the same components as the output timer of the above-mentioned first embodiment or like components, and therefore the description about the components will be omitted hereinafter. In FIG. 3, reference numeral 9 denotes a free running down-counter which is built to continue to run unless a stop signal from outside is applied thereto even though an event signal is applied to the output counter, and which counts clock pulses applied thereto at predetermined intervals, and decrements and holds the current count as a numerical count value, and reference numeral 10 denotes a register for storing a predetermined value (x) to be subtracted which defines the pulse duration of the output signal which is to be sent out by the output timer according to the second embodiment of the present invention. Reference numeral 11 denotes a subtracter which subtracts the predetermined value (x) to be subtracted stored in the register 10 from the count value of the free running down-counter 9 which has been captured by the capture register 6.

Figure 4:
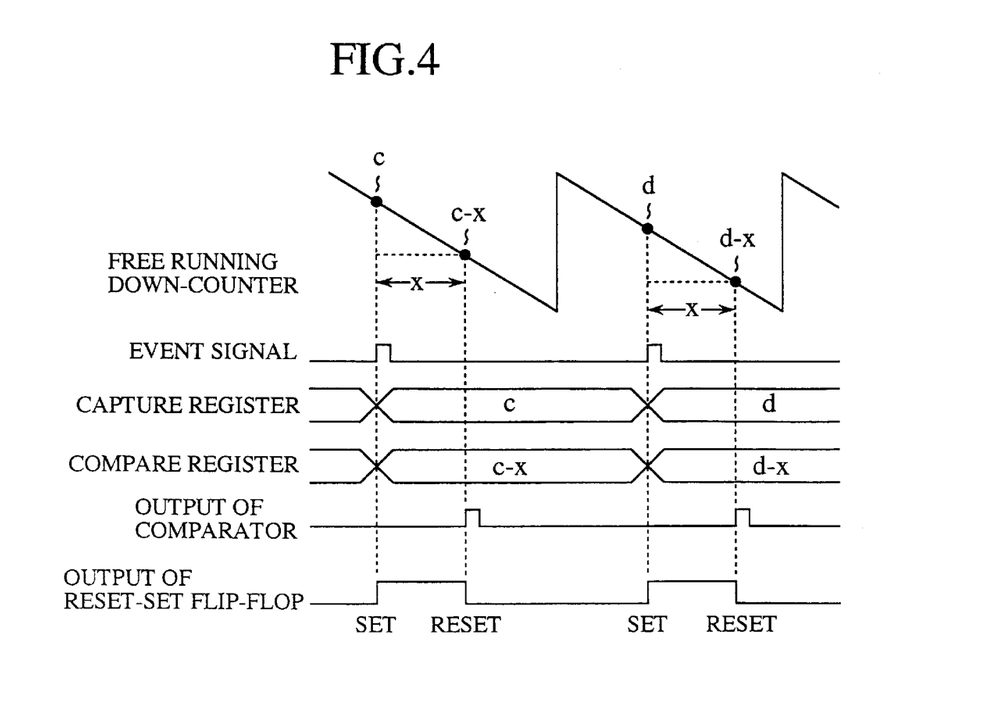
FIG. 4 is a timing chart showing the operation of the output timer according to the second embodiment of the present invention shown in FIG. 3.

Referring next to FIG. 4, there is illustrated a timing chart showing the operation of the output timer according to the second embodiment of the present invention shown in FIG. 3. A description will be made as to the operation of the output timer with reference to FIGS. 3 and 4.

When an event occurs, an event signal informing the occurrence of the event is applied to the event terminal 1 if it is necessary to activate the output timer. The event signal applied to the event terminal 1 is then delivered to the set terminal S of the set-reset flip-flop 5. As a result, the output signal which appears at the output terminal OUT of the set-reset flip-flop 5 makes a LOW to HIGH transition, as shown in FIG. 2. Simultaneously, the transmission gate 14 connects the output terminal of the free running down-counter 9 to the input terminal of the capture register 6 in response to the event signal applied thereto via the event terminal 1 so as to deliver the current count value (c) held by the free running down-counter 9 to the capture register 6. The capture register 6 thus captures the current count value (c) held by the free running down-counter 9. The subtracter 11 then subtracts a predetermined value (x) to be subtracted, which is prestored in the register 10 and which is equal to a decrement corresponding to the pulse duration of a one-shot pulse asserted HIGH of the output signal which will appear at the output terminal OUT, from the count value (c) which has been captured by the capture register 6, and then stores the subtraction result (c−x) in the compare register 3. In other words, the subtracter 11 obtains the count value which the free running down-counter 9 will reach at the expiration of a predetermined time interval which corresponds to the predetermined pulse duration since the output timer receives the event signal.

After that, the comparator 4 starts to compare the current count value held by the free running down-counter 9 with the subtraction result (c−x) stored in the compare register 3. When they are coincident, that is, when the free running down-counter 9 reaches the subtraction result (c−x), the comparator 4 furnishes a coincidence signal indicating that the current count value reaches the subtraction result (c−x) to the reset terminal R of the set-reset flip-flop 5. As a result, the set-reset flip-flop 5 is reset and hence the output signal which appears at the output terminal OUT is caused to make a HIGH to LOW transition. The output timer thus completes the delivery of a one-shot output asserted HIGH having the pulse duration which corresponds to the predetermined value (x) to be subtracted.

Similarly, when another event occurs and the capture register 6 then captures the current count value (d) of the free running down-counter 9, the subtracter 11 subtracts the predetermined value (x) to be subtracted which is prestored in the register 10 from the count value (d) of the free running down-counter 9 which has been captured by the captured register 6, and then stores the subtraction result (d−x) in the compare register 3. The comparator 4 then starts to compare the current count value held by the free running down-counter 9 with the subtraction result (d−x) stored in the compare register 3. When the free running down-counter 9 reaches the subtraction result (d−x), the comparator 4 furnishes a coincidence signal indicating that the current count value reaches the subtraction result (d−x) to the reset terminal R of the set-reset flip-flop 5. As a result, the set-reset flip-flop 5 is reset and hence the output signal which appears at the output terminal OUT is caused to make a HIGH to LOW transition. The output timer thus completes the delivery of a further one-shot output asserted HIGH having the pulse duration which corresponds to the predetermined value (x) to be subtracted, like the aforementioned case.

As mentioned above, the output timer according to the second embodiment of the present invention implements the interrupt processing to read a count value held by the free running down-counter 9, subtract a predetermined value (x) to be subtracted from the count value, and store the subtraction result in the compare register 3, which has been implemented via software in the CPU of a prior art output timer, by using the hardware. Accordingly, the load on the CPU can be reduced. Furthermore, the subtraction result can be stored in the compare register 3 at a higher speed as compared with the conventional interrupt processing implemented via software. This results in being able to prevent the set-reset flip-flop 5 from being kept in a state wherein it is not reset. The second embodiment of the present invention thus offers an advantage of being able to provide an output timer having real time capability superior to conventional output timers.

Furthermore, since the free running down-counter 9 for use in the output timer of the second embodiment can continue to run even though an event signal from outside is applied to the output timer, the output timer can send out a one-shot output with stability at all times. It will be obvious to those skilled in the art that the second embodiment is not limited to such the structure and a normal down-counter can be used instead of the free running down-counter 9.

Third Embodiment

Figure 5:
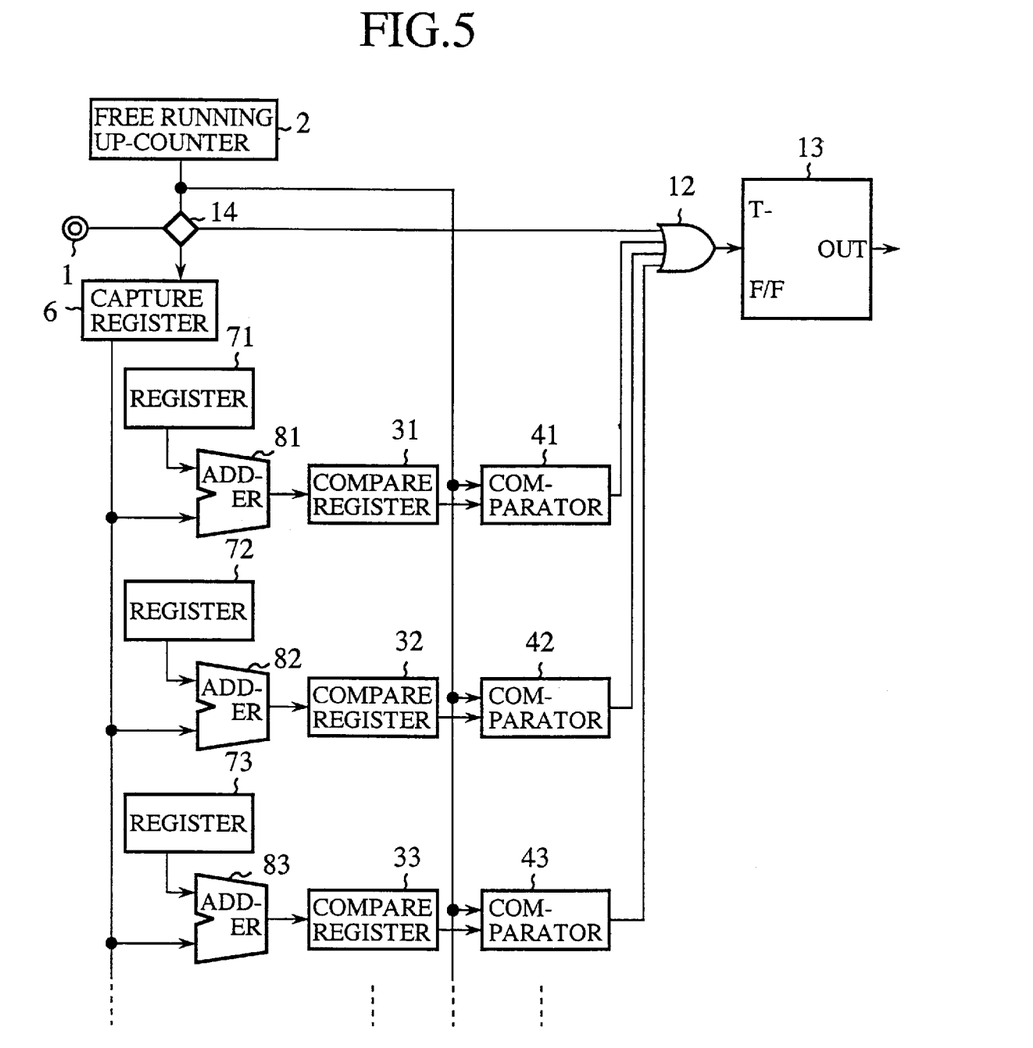
FIG. 5 is a block diagram showing the structure of an output timer according to a third embodiment of the present invention.

Referring now to FIG. 5, there is illustrated a block diagram showing the structure of an output timer according to a third embodiment of the present invention. In the figure, the same reference numerals as FIG. 1 denote the same components as the output timer of the above-mentioned first embodiment or like components, and therefore the description about the components will be omitted hereinafter. In FIG. 5, each of reference numerals 31, 32, and 33 denotes a compare register, reference numeral 41 denotes a comparator for comparing the current count value held by the free running up-counter 2 with an addition result stored in the compare register 31, and for furnishing a coincidence signal when they are equal to each other, reference numeral 42 denotes a comparator for comparing the current count value held by the free running up-counter 2 with an addition result stored in the compare register 32, and for furnishing a coincidence signal when they are equal to each other, and reference numeral 43 denotes a comparator for comparing the current count value held by the free running up-counter 2 with an addition result stored in the compare register 33, and for furnishing a coincidence signal when they are equal to each other. Reference numerals 71, 72, and 73 denote registers for storing respective predetermined values (x, y, z) to be added which define the pulse durations of two successive output pulses which are to be sent out by the output timer according to the third embodiment of the present invention. Each of reference numerals 81, 82, and 83 denotes an adder, reference numeral 12 denotes an OR gate having a plurality of input terminals one of which is connected to the event terminal 1, and the others of which are connected to the plurality of comparators 41, 42, and 43, and reference numeral 13 denotes a T (trigger or toggle) flip-flop including its input terminal connected to the output terminal of the OR gate 12 and its output terminal OUT. The T flip-flop 13 changes the state of its output with each rising edge of an input signal applied to its single input terminal.

Figure 6:
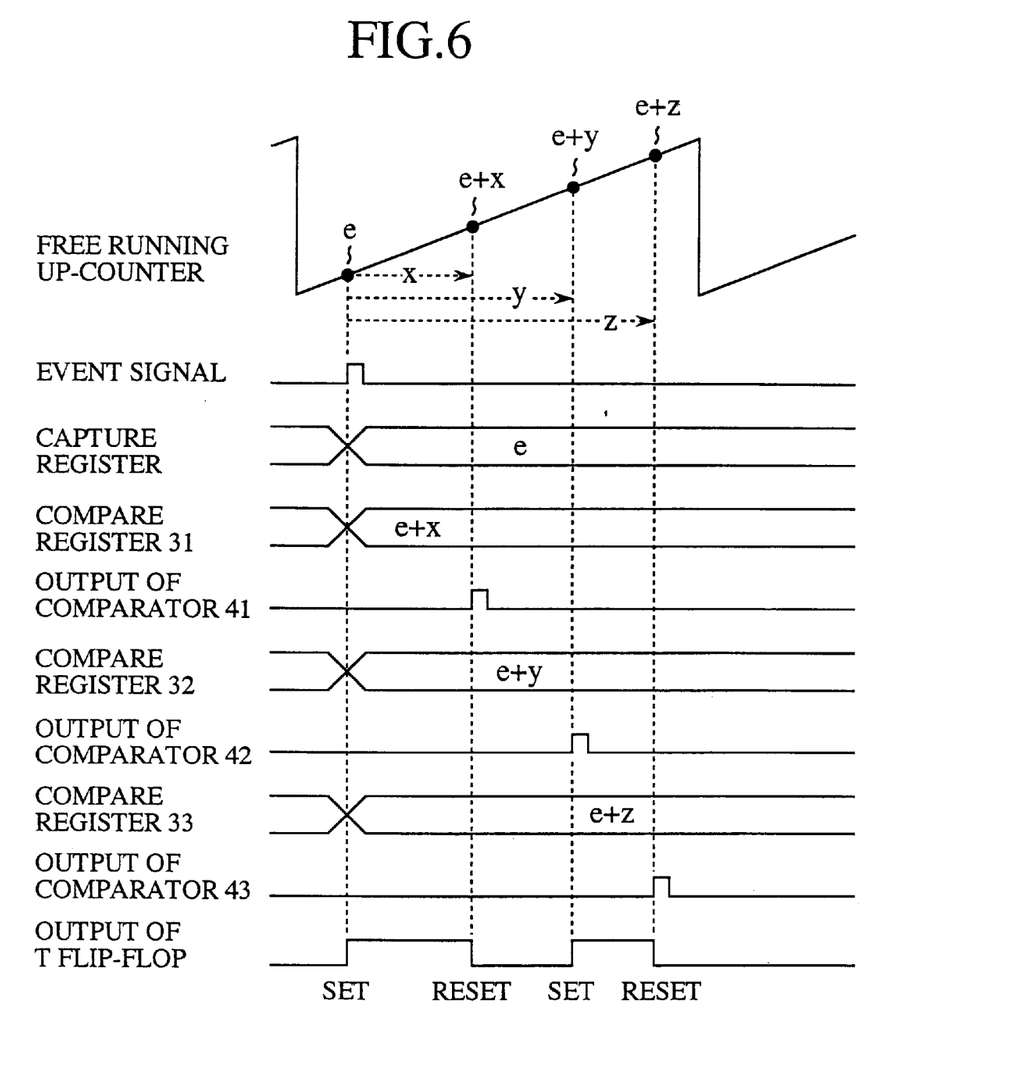
FIG. 6 is a timing chart showing the operation of the output timer according to the third embodiment of the present invention shown in FIG. 5.

Referring next to FIG. 6, there is illustrated a timing chart showing the operation of the output timer according to the third embodiment of the present invention shown in FIG. 5. A description will be made as to the operation of the output timer with reference to FIGS. 5 and 6.

When an event occurs, an event signal informing the occurrence of the event is applied to the event terminal 1 if it is necessary to activate the output timer. The event signal applied to the event terminal 1 is then delivered to the input terminal of the T flip-flop 13 by way of the OR gate 12. As a result, the T flip-flop 13 is set and hence it causes the output signal which appears at the output terminal OUT thereof to make a LOW to HIGH transition, as shown in FIG. 6. Simultaneously, the transmission gate 14 connects the output terminal of the free running up-counter 2 to the input terminal of the capture register 6 in response to the event signal applied thereto via the event terminal 1 so as to deliver the current count value (e) held by the free running up-counter 2 to the capture register 6. The capture register 6 thus captures the current count value (e) held by the free running up-counter 2. The plurality of adders 81, 82, and 83 then add a plurality of predetermined values (x, y, z) to be added, which are respectively prestored in the plurality of registers 71, 72, and 73, to the count value (e) which has been captured by the capture register 6, respectively, and then store the addition results (e+x), (e+y), and (e+z) in the plurality of compare registers 31, 32, and 33, respectively. In other words, each of the plurality of adders 81, 82, and 83 obtains a count value which the free running up-counter 2 will reach at the expiration of a corresponding predetermined time interval which corresponds to a predetermined pulse duration or the like since the output timer receives the event signal.

After that, the plurality of comparators 41, 42, and 43 start to compare the current count value held by the free running up-counter 2 with the addition results (e+x), (e+y), and (e+z) stored in the plurality of compare registers 31, 32, and 33, respectively. When the free running up-counter 2 reaches one of the addition results (e+x), (e+y), and (e+z), a corresponding one of the plurality of comparators 41, 42, and 43 furnishes a coincidence signal indicating that the current count value reaches the one of the addition results (e+x), (e+y), and (e+z) to the input terminal of the T flip-flop 13 by way of the OR gate 12. In an example shown in FIG. 6, the plurality of predetermined values (x, y, z) have the inequality relation x<y<z. Thus, when the current count value held by the free running up-counter 2 reaches the addition result (e+x) stored in the compare register 31, the comparator 41 furnishes a coincidence signal to the T flip-flop 13 by way of the OR gate 12. As a result, the T flip-flop 13 is reset and hence the output signal which appears at the output terminal OUT is caused to make a HIGH to LOW transition. The output timer thus delivers an output pulse asserted HIGH having the pulse duration which corresponds to the predetermined value (x) to be added. Furthermore, when the current count value held by the free running up-counter 2 reaches the addition result (e+y) stored in the second compare register 32, the second comparator 42 furnishes a coincidence signal to the T flip-flop 13 by way of the OR gate 12. As a result, the T flip-flop 13 is set again and hence the output signal which appears at the output terminal OUT is caused to make a LOW to HIGH transition. After that, when the current count value held by the free running up-counter 2 reaches the addition result (e+z) stored in the third compare register 33, the third comparator 43 furnishes a coincidence signal to the T flip-flop 13 by way of the OR gate 12. As a result, the T flip-flop 13 is reset again and hence the output signal which appears at the output terminal OUT is caused to make a HIGH to LOW transition again. The output timer thus delivers a second output pulse asserted HIGH having the pulse duration which corresponds to the difference (z−y) between the predetermined values (y, z) after the delivery of the first output pulse asserted HIGH having the pulse duration which corresponds to the predetermined value (x). The first and second output pulses are sent out at the predetermined interval which corresponds to the difference (y−x) between the predetermined values (x, y).

Thus the output timer according to the third embodiment of the present invention can generate two successive pulses each having an arbitrary pulse duration at an arbitrary time interval by prestoring arbitrary values (x, y, z) to be added into the plurality of registers 71, 72, and 73, and resetting, setting, and resetting the T flip-flop 13 successively at the expiration of predetermined time intervals which correspond to the predetermined values (x, y, z), respectively, after the occurrence of an event.

As mentioned above, the output timer according to the third embodiment of the present invention implements the interrupt processing to read a count value held by the free running up-counter 2, add the plurality of predetermined values to be added to the count value, and store the addition results in the plurality of compare registers 31, 32, and 33, which has been implemented via software in the CPU of a prior art output timer, by using the hardware. Accordingly, the load on the CPU can be reduced. Furthermore, the addition results can be stored in the plurality of compare registers 31, 32, and 33 at a higher speed as compared with the conventional interrupt processing implemented via software. This results in being able to prevent the T flip-flop 13 from being kept in a state wherein it is not reset. The third embodiment of the present invention thus offers an advantage of being able to provide an output timer having real time capability superior to conventional output timers and capable of generating successive pulses each having an arbitrary pulse duration at an arbitrary time interval.

Furthermore, since the free running up-counter 2 for use in the output timer of the third embodiment can continue to run even though an event signal from outside is applied to the output timer, the output timer can send out successive output pulses with stability at all times. It will be obvious to those skilled in the art that the third embodiment is not limited to such the structure and a normal up-counter can be used instead of the free running up-counter 2.

As previously explained, the output timer according to the third embodiment of the present invention is provided with the three compare registers 31, 32, and 33, the three comparators 41, 42, and 43, the three registers 71, 72, and 73 each for storing an addition result, and the three adders 81, 82, and 83. It will be obvious to those skilled in the art that the third embodiment is not limited to such the structure and the output timer can comprise an arbitrary number of compare registers, comparators, registers each for storing an addition result, and adders, the number of each of which corresponds to a desired number of successive output pulses.

Fourth Embodiment

Figure 7:
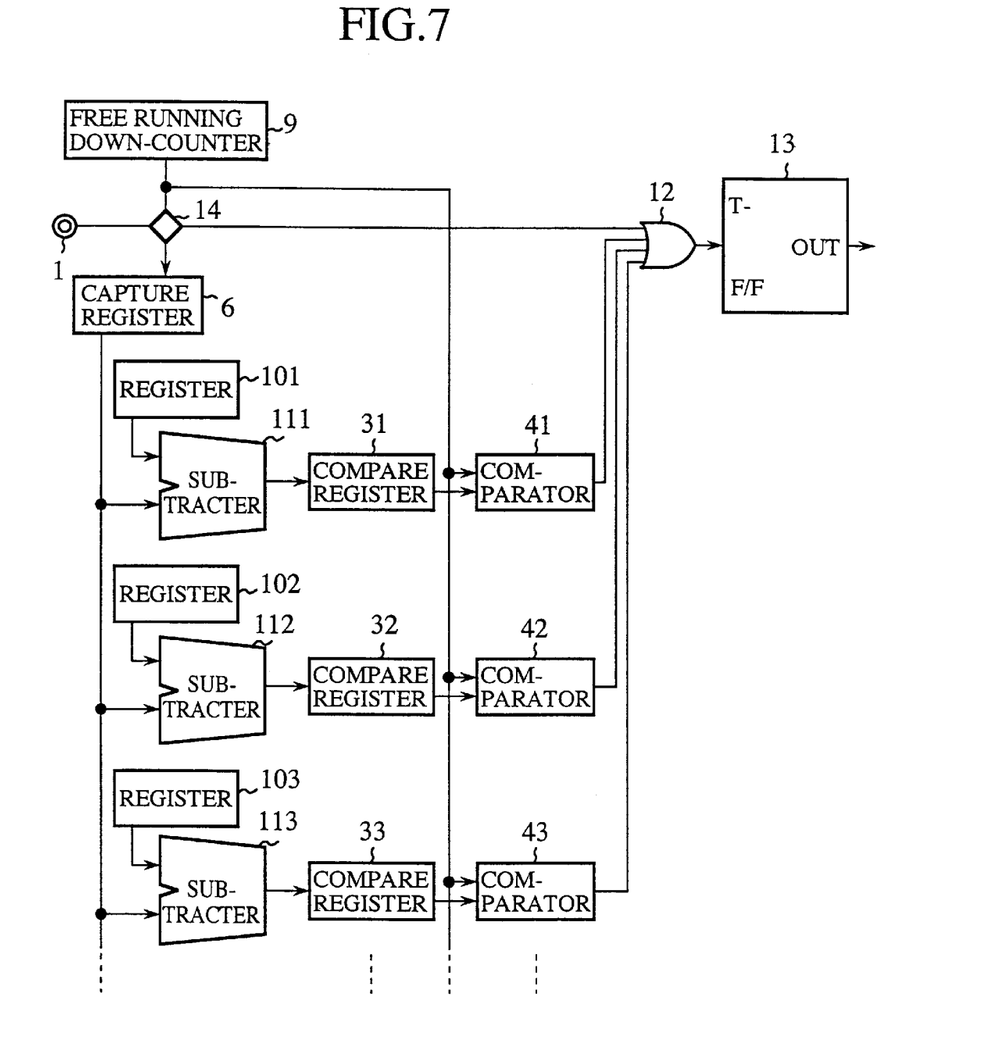
FIG. 7 is a block diagram showing the structure of an output timer according to a fourth embodiment of the present invention.

Referring now to FIG. 7, there is illustrated a block diagram showing the structure of an output timer according to a fourth embodiment of the present invention. In the figure, the same reference numerals as FIG. 1 denote the same components as the output timer of the above-mentioned first or third embodiment or like components, and therefore the description about the components will be omitted hereinafter. In FIG. 7, each of reference numerals 31, 32, and 33 denotes a compare register, reference numeral 41 denotes a comparator for comparing the current count value held by the free running down-counter 9 with a subtraction result stored in the compare register 31, and for furnishing a coincidence signal when they are equal to each other, reference numeral 42 denotes a comparator for comparing the current count value held by the free running down-counter 9 with a subtraction result stored in the compare register 32, and for furnishing a coincidence signal when they are equal to each other, and reference numeral 43 denotes a comparator for comparing the current count value held by the free running down-counter 2 with a subtraction result stored in the compare register 33, and for furnishing a coincidence signal when they are equal to each other. Reference numerals 101, 102, and 103 denote registers for storing respective predetermined values (x, y, z) to be subtracted which define the pulse durations of two successive output pulses which are to be sent out by the output timer according to the fourth embodiment of the present invention. Each of reference numerals 111, 112, and 113 denotes a subtracter.

Figure 8:
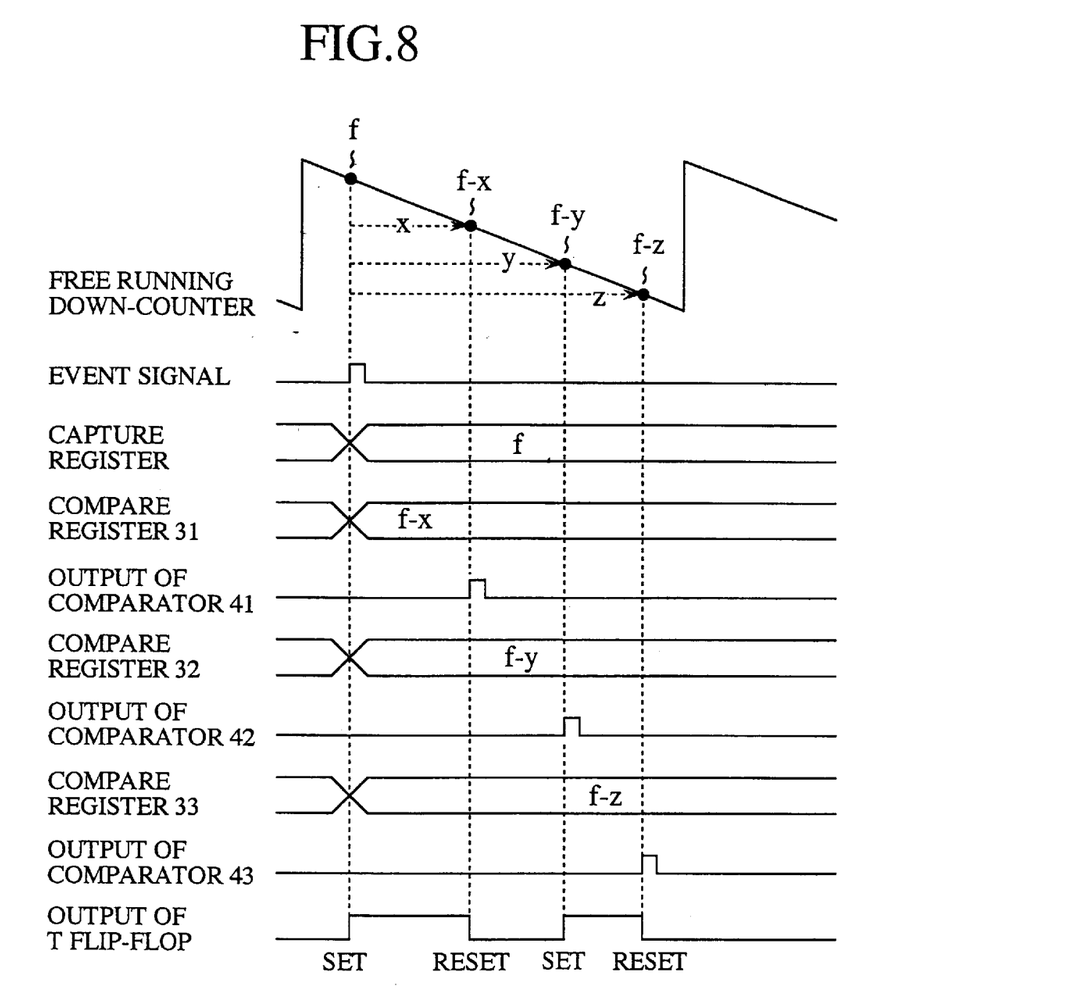
FIG. 8 is a timing chart showing the operation of the output timer according to the fourth embodiment of the present invention shown in FIG. 7.

Referring next to FIG. 8, there is illustrated a timing chart showing the operation of the output timer according to the fourth embodiment of the present invention shown in FIG. 7. A description will be made as to the operation of the output timer with reference to FIGS. 7 and 8.

When an event occurs, an event signal informing the occurrence of the event is applied to the event terminal 1 if it is necessary to activate the output timer. The event signal applied to the event terminal 1 is then delivered to the input terminal of the T flip-flop 13 by way of the OR gate 12. As a result, the T flip-flop 13 is set and hence it causes the output signal which appears at the output terminal OUT thereof to make a LOW to HIGH transition, as shown in FIG. 8. Simultaneously, the transmission gate 14 connects the output terminal of the free running down-counter 9 to the input terminal of the capture register 6 in response to the event signal applied thereto via the event terminal 1 so as to deliver the current count value (f) held by the free running down-counter 9 to the capture register 6. The capture register 6 thus captures the current count value (f) held by the free running down-counter 9. The plurality of subtracters 111, 112, and 113 then subtract a plurality of predetermined values (x, y, z) to be added, which are respectively prestored in the plurality of registers 71, 72, and 73, from the count value (f) which has been captured by the capture register 6, respectively, and then store the subtraction results (f−x), (f−y), and (f−z) in the plurality of compare registers 31, 32, and 33, respectively. In other words, each of the plurality of subtracters 111, 112, and 113 obtains a count value which the free running down-counter 9 will reach at the expiration of a predetermined time interval which corresponds to a predetermined pulse duration or the like since the output timer receives the event signal.

After that, the plurality of comparators 41, 42, and 43 start to compare the current count value held by the free running down-counter 9 with the subtraction results (f−x), (f−y), and (f−z) stored in the plurality of compare registers 31, 32, and 33, respectively. When the free running down-counter 9 reaches one of the subtraction results (f−x), (f−y), and (f−z), a corresponding one of the plurality of comparators 41, 42, and 43 furnishes a coincidence signal indicating that the free running down-counter 9 reaches the one of the subtraction results (f−x), (f−y), and (f−z) to the T flip-flop 13 by way of the OR gate 12. In an example shown in FIG. 8, the plurality of predetermined values (x, y, z) have the inequality relation x<y<z. Thus, when the current count value held by the free running down-counter 9 reaches the subtraction result (f−x) stored in the compare register 31, the comparator 41 furnishes a coincidence signal to the T flip-flop 13 by way of the OR gate 12. As a result, the T flip-flop 13 is reset and hence the output signal which appears at the output terminal OUT is caused to make a HIGH to LOW transition. The output timer thus delivers an output pulse asserted HIGH having the pulse duration which corresponds to the predetermined value (x) to be added. Furthermore, when the current count value held by the free running down-counter 9 reaches the subtraction result (f−y) stored in the second compare register 32, the second comparator 42 furnishes a coincidence signal to the T flip-flop 13 by way of the OR gate 12. As a result, the T flip-flop 13 is set again and hence the output signal which appears at the output terminal OUT is caused to make a LOW to HIGH transition. After that, when the current count value held by the free running down-counter 9 reaches the subtraction result (f−z) stored in the third compare register 33, the third comparator 43 furnishes a coincidence signal to the T flip-flop 13 by way of the OR gate 12. As a result, the T flip-flop 13 is reset again and hence the output signal which appears at the output terminal OUT is caused to make a HIGH to LOW transition again. The output timer thus delivers a second output pulse asserted HIGH having the pulse duration which corresponds to the difference (z−y) between the predetermined values (y, z) after the delivery of the first output pulse asserted HIGH having the pulse duration which corresponds to the predetermined value (x). The first and second output pulses are sent out at the predetermined interval which corresponds to the difference (y−x) between the predetermined values (x, y).

Thus the output timer according to the fourth embodiment of the present invention can generate two successive pulses each having an arbitrary pulse duration at an arbitrary time interval by prestoring arbitrary values (x, y, z) to be subtracted into the plurality of registers 101, 102, and 103, and resetting, setting, and resetting the T flip-flop 13 successively at the expiration of predetermined time intervals which correspond to the predetermined values (x, y, z), respectively, after the occurrence of an event.

As mentioned above, the output timer according to the fourth embodiment of the present invention implements the interrupt processing to read a count value held by the free running down-counter 9, subtract the plurality of predetermined values to be subtracted from the count value, and store the subtraction results in the plurality of compare registers 31, 32, and 33, which has been implemented via software in the CPU of a prior art output timer, by using the hardware. Accordingly, the load on the CPU can be reduced. Furthermore, the addition results can be stored in the plurality of compare registers 31, 32, and 33 at a higher speed as compared with the conventional interrupt processing implemented via software. This results in being able to prevent the T flip-flop 13 from being kept in a state wherein it is not reset. The fourth embodiment of the present invention thus offers an advantage of being able to provide an output timer having real time capability superior to conventional output timers and capable of generating successive pulses each having an arbitrary pulse duration at an arbitrary time interval.

Furthermore, since the free running down-counter 9 for use in the output timer of the fourth embodiment can continue to run even though an event signal from outside is applied to the output timer, the output timer can send out successive output pulses with stability at all times. It will be obvious to those skilled in the art that the third embodiment is not limited to such the structure and a normal down-counter can be used instead of the free running down-counter 9.

As previously explained, the output timer according to the fourth embodiment of the present invention is provided with the three compare registers 31, 32, and 33, the three comparators 41, 42, and 43, the three registers 71, 72, and 73 each for storing an addition result, and the three adders 81, 82, and 83. It will be obvious to those skilled in the art that the third embodiment is not limited to such the structure and the output timer can comprise an arbitrary number of compare registers, comparators, registers each for storing an addition result, and adders, the number of each of which corresponds to a desired number of successive output pulses.

As previously mentioned, the present invention offers the following advantages.

In accordance with the present invention, there is provided an output timer comprising an event terminal for receiving an event signal indicating the occurrence of an event, a counter for counting clock pulses applied thereto and for holding the count as a numerical count value, a capture register for capturing and storing the count value held by the counter in corporation with a transmission gate in response to an event signal applied to the output timer by way of the event terminal, another register for storing a predetermined value which corresponds to a predetermined time interval, a computation unit for computing a count value which the counter will reach at the expiration of the predetermined time interval from the count value stored in the capture register and the predetermined value stored in the compare register, a compare register for storing the count value obtained by the computation unit as a computation result, a comparator for comparing a count value held by the counter with the computation result stored in the compare register and for furnishing a coincidence signal by way of an output terminal when they are equal to each other, and a reset-set flip-flop having a first input terminal connected to the event terminal and used for setting the reset-set flip-flop and a second input terminal connected to the output terminal of the comparator and used for resetting the reset-set flip-flop. Therefore, the output timer can generate a one-shot output without increasing the load on the CPU which is incorporated into equipment provided with the output timer of this embodiment. The output timer can store the computation result in the compare register at a high speed. Accordingly, the embodiment of the present invention provides an advantage of being able to provide an output timer in which the reset-set flip-flop built therein can be prevented from being kept in a state wherein it is not reset, and having real time capability superior to conventional output timers.

The counter can be a free running counter which can continue to run unless a stop signal from outside is applied thereto. The output timer can send out a one-shot output with stability.

In accordance with a preferred embodiment of the present invention, the free running counter can be a free running up-counter which increments its count value held therein each time it counts a clock pulse, and the computation unit is an adder which adds the predetermined value stored in the other register to the count value stored in the capture register and then furnishes the addition result. Therefore, the output timer can generate a one-shot output without an increase in the load on the CPU which is incorporated into equipment provided with the output timer of this embodiment. The output timer can store the computation result in the compare register at a high speed. Accordingly, the embodiment of the present invention provides an advantage of being able to provide an output timer in which the reset-set flip-flop built therein can be prevented from being kept in a state wherein it is not reset, and having real time capability superior to conventional output timers.

In accordance with another preferred embodiment of the present invention, the free running counter can be a free running down-counter which decrements its count value held therein each time it counts a clock pulse, and the computation unit is a subtracter which subtracts the predetermined value stored in the other register from the count value stored in the capture register and then furnishes the subtraction result. Therefore, the output timer can generate a one-shot output without an increase in the load on the CPU incorporated into equipment provided with the output timer of this embodiment. The output timer can store the computation result in the compare register at a high speed. Accordingly, the embodiment of the present invention provides an advantage of being able to provide an output timer in which the reset-set flip-flop built therein can be prevented from being kept in a state wherein it is not reset, and having real time capability superior to conventional output timers.

In accordance with another preferred embodiment of the present invention, there is provided an output timer comprising an event terminal for receiving an event signal indicating the occurrence of an event, a counter for counting clock pulses applied thereto and for holding the count as a numerical count value, a capture register for capturing and storing the count value held by the counter in corporation with a transmission gate in response to an event signal applied to the event terminal, a first storage unit comprised of a plurality of registers for storing a plurality of predetermined values which correspond to a plurality of predetermined time intervals, respectively, a computation unit for computing a plurality of count values which the counter will reach at the expiration of the plurality of predetermined time intervals from the count value stored in the capture register and the plurality of predetermined values stored in the first storage unit, a second storage unit comprised of a plurality of compare registers for storing the plurality of count values computed by the computation unit as a plurality of computation results, a plurality of comparators each for comparing a count value held by the counter with each of the plurality of computation results stored in the second storage unit and for furnishing a coincidence signal by way of an output terminal when they are equal to each other, an OR gate having a plurality of input terminals one of which is connected to the event terminal and the others of which are connected to the plurality of output terminals of the plurality of comparators, respectively, and an output terminal, and a T flip-flop having an input terminal connected to the output terminal of the OR gate. Therefore, the output timer can generate successive output pulses each having an arbitrary pulse duration at arbitrary time intervals without an increase in the load on the CPU which is incorporated into equipment provided with the output timer of this embodiment. The output timer can store the computation results in the second storage unit including a plurality of compare registers at a high speed. Accordingly, the embodiment of the present invention provides an advantage of being able to provide an output timer in which the T flip-flop built therein can be prevented from being kept in a state wherein it is not reset, and having real time capability superior to conventional output timers.

The counter can be a free running counter which can continue to run unless a stop signal from outside is applied thereto. The output timer can generate successive output pulses each having an arbitrary pulse duration at arbitrary time intervals with stability.

In accordance with another preferred embodiment of the present invention, the free running counter can be a free running up-counter which increments its count value held therein each time it counts a clock pulse, and the computation unit is a plurality of adders each of which adds each of the plurality of predetermined values stored in the first storage unit to the count value stored in the capture register and then furnishes the addition result. Therefore, the load on the CPU which is incorporated into equipment provided with the output timer of this embodiment can be reduced. Furthermore, the output timer can store the computation results in the second storage unit at a high speed. Accordingly, the embodiment of the present invention provides an advantage of being able to provide an output timer in which the T flip-flop built therein can be prevented from being kept in a state wherein it is not reset, and having real time capability superior to conventional output timers.

In accordance with another preferred embodiment of the present invention, the free running counter can be a free running down-counter which decrements its count value held therein each time it counts a clock pulse, and the computation unit is a plurality of subtracters each of which subtracts each of the plurality of predetermined values stored in the first storage unit from the count value stored in the capture register and then furnishes the subtraction result. Therefore, the load on the CPU which is incorporated into equipment provided with the output timer of this embodiment can be reduced. Furthermore, the output timer can store the computation results in the second storage unit at a high speed. Accordingly, the embodiment of the present invention provides an advantage of being able to provide an output timer in which the T flip-flop built therein can be prevented from being kept in a state wherein it is not reset, and having real time capability superior to conventional output timers.

Many widely different embodiments of the present invention may be constructed without departing from the spirit and scope of the present invention. It should be understood that the present invention is not limited to the specific embodiments described in the specification, except as defined in the appended claims.

What is claimed is:

1. The output timer comprising:

an event terminal for receiving an event signal indicating occurrence of an event;

a counter for counting clock pulses applied to the counter and for holding a count as a numerical count value;

capture means for capturing and storing the numerical count value held by said counter in response to application of the event signal to said output timer through said event terminal;

first storage means for storing a first value corresponding to a first time interval;

computation means for computing a count value which said counter will reach upon expiration of the first time interval from the numerical count value stored in said capture means and the first value stored in said first storage means;

second storage means for storing the count value computed by said computation means as a computation result;

a comparator, including an output terminal for comparing the numerical count value held by said counter with the computation result stored in said second storage means and for furnishing a coincidence signal through the output terminal when the count value held by said counter and the computation result are equal to each other; and a set-reset flip-flop, having a first input terminal connected to said event terminal, for setting said set-reset flip-flop, and a second input terminal connected to said output terminal of said comparator, for resetting said set-reset flip-flop.

2. The output timer according to claim 1, wherein said counter is a free running counter continuing to count until a stop signal from outside is applied to said free running counter.

3. The output timer according to claim 2, wherein said free running counter is a free running up-counter incrementing the numerical count value held in said free running up-counter each time said free running up-counter counts a clock pulse, and said computation means is an adder adding the first value stored in said first storage means to the numerical count value stored in said capture means and furnishing a sum.

4. The output timer according to claim 2, wherein said free running counter is a free running down-counter decrementing the numerical count value held in said free running down-counter each time said free running down-counter counts a clock pulse, and said computation means is a subtracter subtracting the first value stored in said first storage means from the numerical count value stored in said capture means and furnishing a difference.

5. An output timer comprising:

an event terminal for receiving an event signal indicating occurrence of an event;

a counter for counting clock pulses applied to said counter and for holding a count as a numerical count value;

capture means for capturing and storing the numerical count value held by said counter in response to application of the event signal to said output timer through said event terminal;

first storage means for storing a plurality of first values corresponding to a plurality of first time intervals, respectively;

computation means for computing a plurality of count values which said counter will reach upon expiration of the plurality of first time intervals from the numerical count value stored in said capture means and the plurality of first values stored in said first storage means;

second storage means for storing the plurality of count values computed by said computation means as a plurality of computation results;

a plurality of comparators, each of said comparators including an output terminal, for comparing the numerical count value held by said counter with each of the plurality of computation results stored in said second storage means and for furnishing a coincidence signal by way of an output terminal when the numerical count value and one of the computation results are equal to each other;

an OR gate having a plurality of input terminals and an output terminal, a first input terminal of said plurality of input terminals being connected to said event terminal and remaining terminals of said plurality of input terminals being respectively connected to an output of one of said plurality of comparators; and a T flip-flop having an input terminal connected to said output terminal of said OR gate.

6. The output timer according to claim 5, wherein said counter is a free running counter continue counting until a stop signal from outside is applied to said free running counter.

7. The output timer according to claim 6, wherein said free running counter is a free running up-counter incrementing the numerical count value held in said free running up-counter each time said free running up-counter counts a clock pulse, and said computation means is a plurality of adders, each adding one of the plurality of first values stored in said first storage means to the numerical count value stored in said capture means and furnishing a sum.

8. The output timer according to claim 6, wherein said free running counter is a free running down-counter decrementing the numerical count value held in said free running down-counter each time said free running down-counter counts a clock pulse, and said computation means is a plurality of subtracters, each subtracter subtracting one of the plurality of first values stored in said first storage means from the numerical count value stored in said capture means and furnishing a difference.

* * * * *